United States Patent
Li et al.

(10) Patent No.: US 7,220,677 B2
(45) Date of Patent: May 22, 2007

(54) WAT PROCESS TO AVOID WIRING DEFECTS

(75) Inventors: Lin-Ping Li, Hsinchu (TW); Yung-Cheng Lu, Taipei (TW); Wen-Chih Chiou, Miaoli (TW); Chih-Hsien Lin, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 111 days.

(21) Appl. No.: 11/106,120

(22) Filed: Apr. 13, 2005

(65) Prior Publication Data
US 2006/0234403 A1    Oct. 19, 2006

(51) Int. Cl.
*H01L 21/302* (2006.01)
*H01L 21/461* (2006.01)

(52) U.S. Cl. ........................ 438/692; 438/475; 438/513; 257/E21.304; 257/E21.521

(58) Field of Classification Search ............... 438/692, 438/474, 475, 14, 513, 740, 687, 689, 688, 438/712, 270, 637, 954, 700, 733
See application file for complete search history.

(56) References Cited

U.S. PATENT DOCUMENTS

| | | | |
|---|---|---|---|
| 6,358,831 B1 * | 3/2002 | Liu et al. | 438/612 |
| 6,638,867 B2 * | 10/2003 | Liu et al. | 438/692 |
| 6,642,153 B1 * | 11/2003 | Chang et al. | 438/725 |
| 6,660,630 B1 * | 12/2003 | Chang et al. | 438/637 |
| 6,746,954 B2 * | 6/2004 | Lee | 438/637 |
| 6,812,156 B2 * | 11/2004 | Day et al. | 438/745 |

* cited by examiner

*Primary Examiner*—David Nhu
(74) *Attorney, Agent, or Firm*—Tung & Associates

(57) ABSTRACT

A method for forming a multi-level semiconductor device to eliminate conductive interconnect protrusions following a WAT test, the method including forming a first metallization layer; carrying out a wafer acceptance testing (WAT) process; and, then carrying out a chemical mechanical polish (CMP) on the metallization layer.

20 Claims, 3 Drawing Sheets

WAT PROCESS TO AVOID WIRING DEFECTS

FIELD OF THE INVENTION

This invention generally relates to metrology methods in micro-integrated circuit manufacturing, and more particularly to an improved metrology method for carrying out a wafer acceptance testing (WAT) process to avoid conductive hump defects and improve formation of an overlying metallization level including avoiding etch stop phenomenon.

BACKGROUND OF THE INVENTION

Since the introduction of semiconductor devices, the size of semiconductor devices has been continuously shrinking, resulting in smaller semiconductor chip size and increased device density. One of the difficult factors in the continuing evolution toward smaller device size and higher density has been the ability to consistently form reliable integrated circuit wiring at smaller critical dimensions. For example, the reliability and electrical continuity of integrated circuitry wiring is determined by electrical continuity measurement methods following formation of a metallization level of circuitry wiring, also referred to as acceptance testing (WAT), to quickly determine and correct processing variables that may be causing circuitry defects.

In addition, a recurring problem in etching high aspect ratio openings in dielectric layers in a damascene formation process relates to a failure of the etching process to completely etch through the dielectric layer, also referred to as etch stop behavior. Etch stop behavior has been associated with the build-up of polymer residues at the bottom of an etched opening which overcomes the steady state anisotropic etching process, prematurely stopping the etching depth of the opening. Subsequently formed damascene wiring interconnects are therefore defective and result in open electrical conductive pathways that can no longer be used, thereby detrimentally affecting yield and performance of a multi-level semiconductor device.

There is a continuing need in the semiconductor device manufacturing art for improved wafer acceptance testing (WAT) methods as well as improved damascene formation processes to improve the yield and performance of multi-level semiconductor devices.

It is therefore an object of the invention to provide an improved wafer acceptance testing (WAT) method as well as an improved damascene formation process to improve the yield and performance of multi-level semiconductor devices, in addition to overcoming other shortcomings of the prior art.

SUMMARY OF THE INVENTION

To achieve the foregoing and other objects, and in accordance with the purposes of the present invention, as embodied and broadly described herein, the present invention provides a method for forming a multi-level semiconductor device to eliminate conductive interconnect protrusions following a WAT test.

In a first embodiment, the method includes forming a first metallization layer; carrying out a wafer acceptance testing (WAT) process; and, then carrying out a chemical mechanical polish (CMP) on the metallization layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method and apparatus of the present invention is explained and is particularly advantageous for avoiding the formation of conductive wiring defects and improving the formation of an overlying metallization (wiring) layer in a single damascene formation process, it will be appreciated that the method may be applied any type of damascene formation process including single damascene and dual damascene formation processes.

Figure 1A:
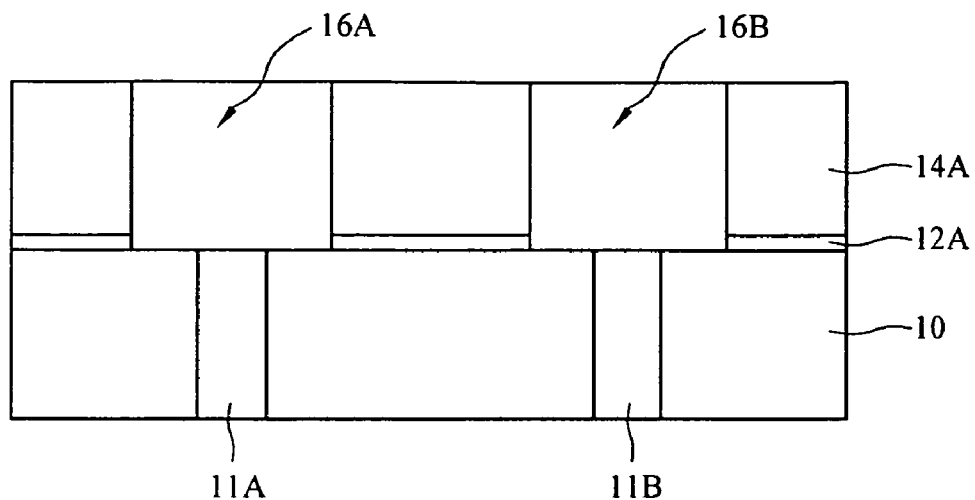
FIG. 1A–1C are cross sectional views of an exemplary damascene formation process according to an embodiment of the present invention.

Referring to FIG. 1A is shown a cross sectional view of a portion of an exemplary multi-level device including dielectric layer 10. The dielectric layer 10, for example, includes conductive regions 11A and 11B, for example to form a first metallization (e.g., M1) layer. It will be appreciated that the conductive regions 11A and 11B in the first metallization layer may be a contact hole (via) in electrical communication with underlying conductive areas or CMOS devices (not shown). An etch stop layer 12A, may be formed over the underlying dielectric layer 10. The etch stop layer 12A may be formed of conventional etch stop materials, including materials such as SiN, SiON, SiC, or SiOC, and formed by conventional process e.g., chemical vapor deposition (CVD), low pressure (LP), plasma enhanced (PE) CVD.

Still referring to FIG. 1A, a dielectric insulating layer 14A is formed on the etch stop layer 12A, followed by conventional damascene formation processes such as photolithographic patterning to form a resist etching mask (not shown) which is then followed by plasma assisted anisotropic etching to form wiring interconnect openings overlying and in communication with the conductive regions 11A and 112. Conventional damascene formation processes are then carried out to backfill the interconnect openings with a conductive material to form a metallization layer (e.g., M2) including conductive interconnects, e.g., 16A and 16B. The interconnects may be trench lines, contact pads, or vias (holes), including dual damascenes. The conductive material may include any conductor, but preferably is a relatively ductile metal such as copper, aluminum, or alloys thereof.

The dielectric insulating layer 14A may be any insulating dielectric layer but is preferably a low-K organic or inorganic dielectric material, including a porous dielectric material. The term "low-K" as used herein means a dielectric constant of less than about 3.4. Exemplary low-K dielectrics may include carbon doped silicon oxide (e.g., Black Diamond™ or the like), organo-silicate glass (OSG), or fluorinated silicate glass (FSG) . The low-K dielectric layer 14A may be formed by conventional processes such as PECVD, spin-on processes, and the like. It will be appreciated that an organic or inorganic bottom anti-reflectance coating (BARC) layer may be formed over the dielectric insulating layer 14A prior to photoresist patterning and interconnect opening etching.

Following formation of the conductive interconnects, which may include a planarization process such as chemical mechanical polishing (CMP), selected conductive interconnects (e.g., contact pads) are probed according to a first conventional Wafer Acceptance Testing (WAT) process, also referred to as a Wafer Electrical Testing (WET), to test electrical properties e.g., DC resistance or resistivity of the interconnect wiring in the underlying metallization layers (e.g., M1 and M2) which are then related to acceptable interconnect formation, e.g., acceptable interconnect electrical resistance. For example, the WAT process to test the electrical properties of the wiring interconnects preferably includes contacting selected conductive interconnects including probing of the interconnects by a conventional probe e.g., a probe tip, to contact and apply a DC voltage to selected conductive interconnects exposed at the wafer process surface, for example contact pads in electrical communication with other conductive interconnects in M1 and/or M2 metallization layers. For example, process control monitor (PCM) features, similar to those being formed in device circuitry portions of a process wafer, are typically formed over selected portions of the process wafer to allow an in-line parametric test (e.g., WET) to take place following interconnect formation processes. It will be appreciated that the method according to the present invention may be applied in connection with any in-line parametric process of any metallization layer (e.g., M1) which includes contacting one or more conductive interconnects, preferably prior to formation of an overlying metallization layer (e.g., M2).

Figure 2A:
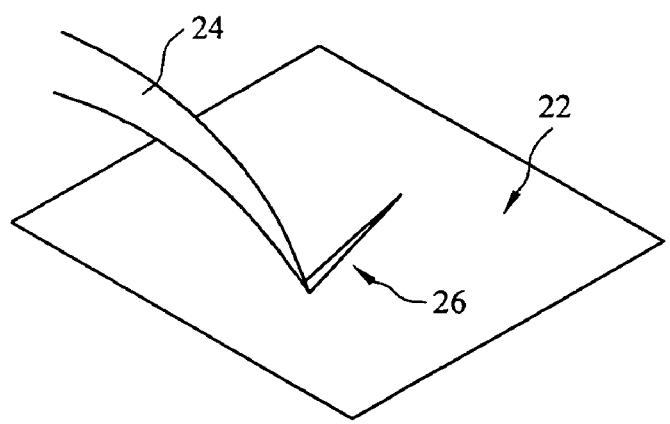
FIGS. 2A and 2B illustrate the exemplary formation of a conductive hump on a contact pad during and following WAT probing.
Figure 2B:
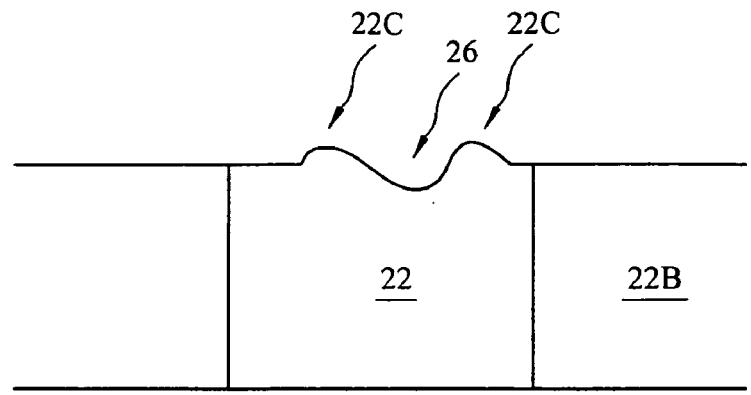

Referring to FIG. 2A, is shown an exemplary conductive contact pad 22 being probed by probe tip 24. For example, in a typical WAT process, probe tips are automatically positioned with respect to the process wafer to contact the contact pad. During the alignment and contact process, a scrub mark e.g., 26 is formed on the contact pad 22. Referring to FIG. 2B is shown an exemplary cross section of damascene contact pad 22 formed in dielectric layer 22B, where a conductive metallic hump portion e.g., 22C on the edge of a scrub mark (probe mark) is formed extending above the planarized surface of the conductive contact. It has been found according to the present invention, that the hump portion 22C may adversely affect subsequent damascene formation processes during formation of an overlying metallization layer, further discussed below.

In one aspect of the invention, an optional thermal and/or plasma treatment is carried out on exposed conductive interconnects prior to carrying out the WAT process. For example, the process wafer surface including the exposed conductive interconnects are subjected to a plasma or thermal treatment including a hydrogen containing and/or an inert gas containing source (e.g., ambient thermal treatment source or plasma treatment source gas). For example, the hydrogen containing source gas may include one or more of $H_2$ and $NH_3$ source gases. The inert gas containing source may be formed of one or more of Ar, He, Xe, and the like. The source gas may include both hydrogen and inert gas. It will be appreciated that both a thermal and plasma treatment may also be performed.

Following the optional plasma or thermal treatment, and the WAT process, the wafer process surface including the exposed conductive interconnects, is subjected to a CMP step to planarize e.g., re-planarize the process surface. For example, the CMP process preferably includes a conventional metal polishing or buffing solution as is known in the art for copper, aluminum, or alloys thereof.

Figure 1B:
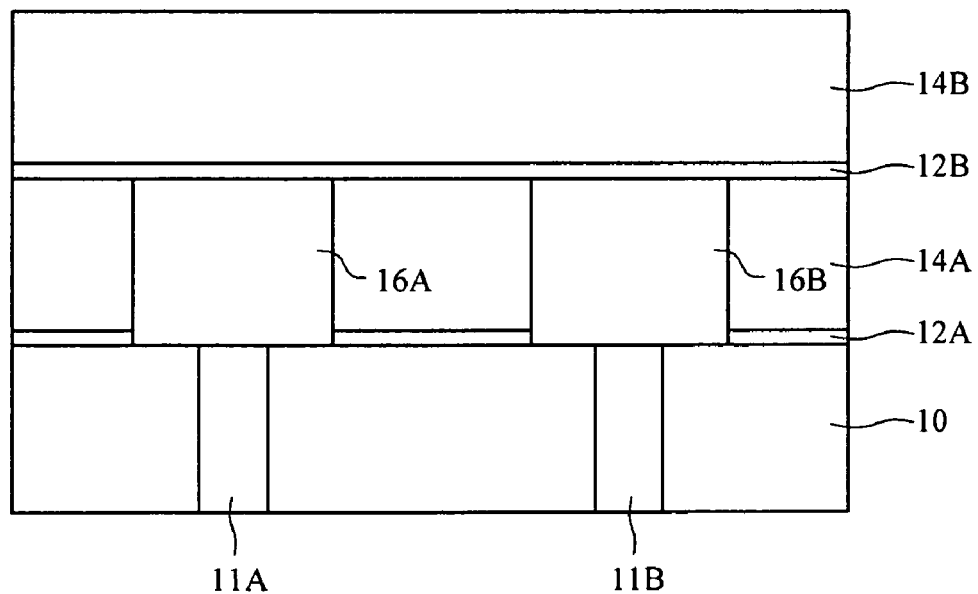

Referring to FIG. 1B, following the CMP process, an overlying metallization layer formation process is undertaken including forming an overlying etch stop layer 12B, and an overlying dielectric layer 14B, preferably formed of the same or different preferred low-K materials outlined for dielectric layer 14A.

Figure 1C:
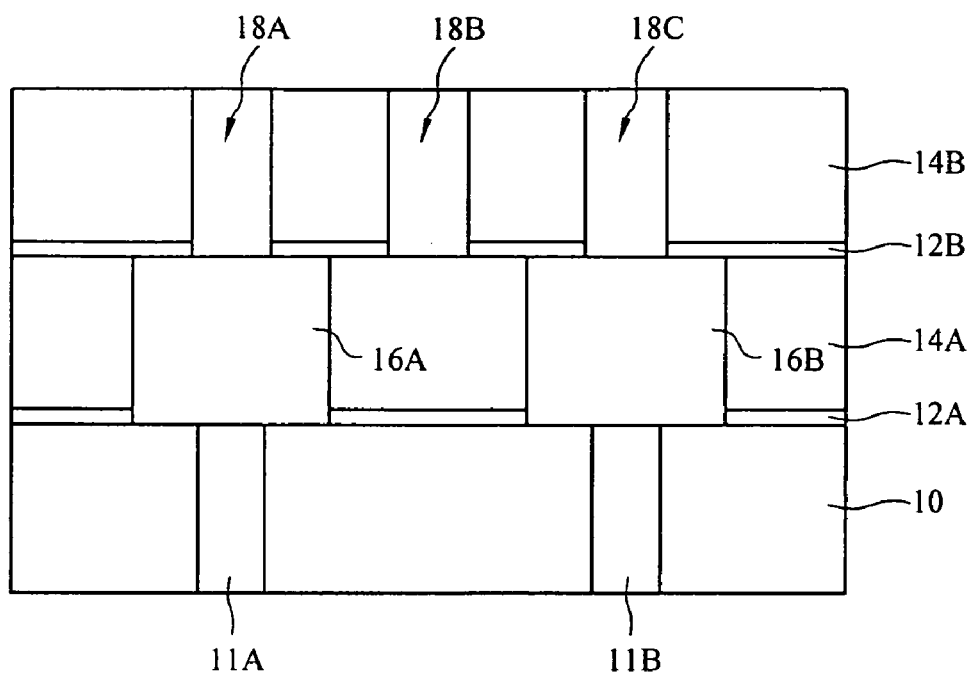

Referring to FIG. 1C, a similar process is then followed as previously outlined to form conductive interconnect features e.g., 18A, 18B, 18C which may be offset from, or overlie, conductive interconnects e.g., 16A and 16B. For example, an overlying dielectric layer using the same or different preferred low-K dielectric as previously outlined for layer 14A is first formed followed by photolithographic patterning and plasma etching e.g., reactive ion etching (RIE). Conventional metal filling processes and planarization, if necessary, are then carried out. For example, features 18A, 18B, and 18C are vias, where feature 18B, which is offset from underlying interconnects, is referred to as an isolated via. A second electrical wafer acceptance testing (WAT) process is then carried out, similar to the first WAT process, including repeating the above optional pre-WAT process thermal and/or plasma treatment and a post-WAT process CMP process in formation of a multi-level semiconductor device.

It has been unexpectedly found, that by carrying out pre and/or post WAT processes according to the present invention, that the yield of isolated vias e.g., 18B is significantly improved. For example, acceptable formation (yield) of isolated vias was significantly improved after carrying out the pre-WAT optional thermal or plasma treatment, and carrying out post-WAT CMP process. Experimental results have show that the yield of isolated vias e.g., $R_c$ (critical resistance) was significantly improved from about 30% to about 75%, resulting in a total yield of about 98% of isolated vias.

The improved yield of isolated vias has been found to be related to the formation of metal (e.g., copper) protrusions (humps) existing over the interconnects (e.g., contact pads) following a WAT process. It is believed that the WAT probing process acts to displace conductive material in probed interconnects to produce the humps as explained above. Subsequently, during plasma etching an overlying interconnect opening including an isolated via opening in an overlying dielectric layer, it is believed that plasma formed current leakage paths are formed from the opening to the metal humps, thereby causing premature termination of the anisotropic etching process resulting in defectively formed (etched) interconnects including isolated vias.

By carrying out at least a post-WAT CMP process as outlined above, and more preferably a pre-WAT thermal or plasma treatment, according to preferred embodiments, the formation of metal humps over probe contacted interconnects is reduced or eliminated, thereby improving etching and therefore yield of isolated vias in overlying levels.

Figure 3:
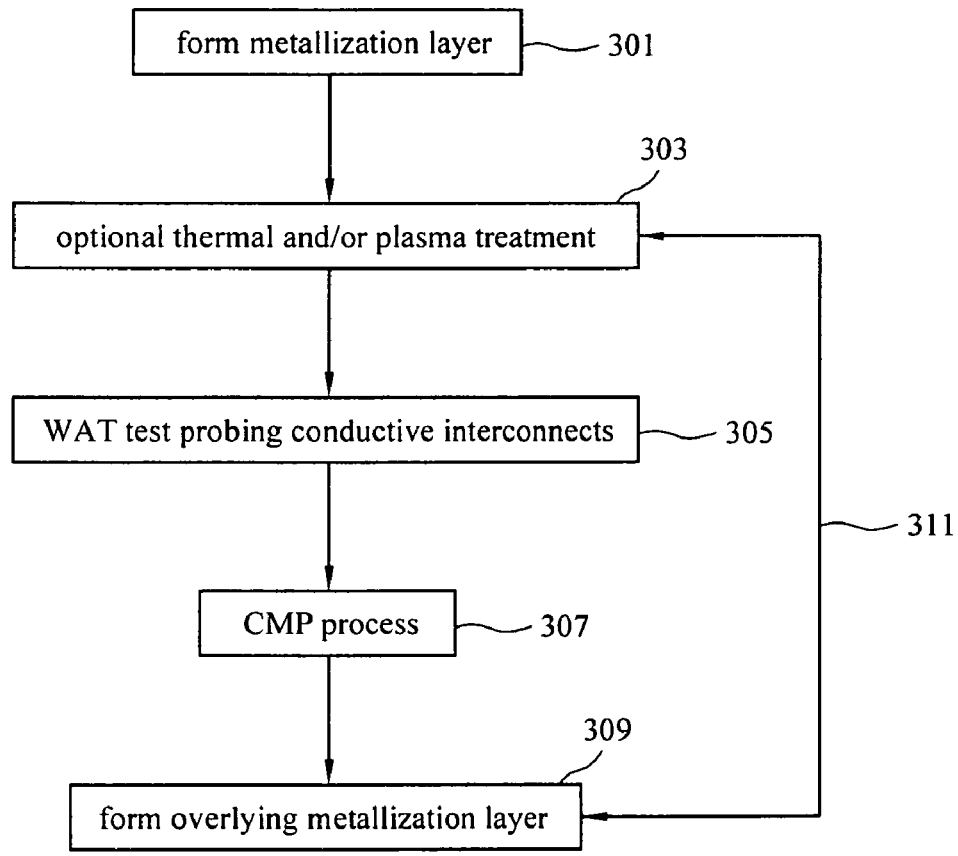
FIG. 3 is a process flow diagram including several aspects of the present invention.

Referring to FIG. 3, is shown a process flow diagram including several embodiments of the present invention. In process 301, a first metallization layer is formed by conventional processes including conductive interconnects. In process 303, an optional thermal and/or plasma treatment with a hydrogen and/or inert gas containing source is performed including on exposed conductive interconnects. In process 305, a first electrical WAT process is performed including probing conductive interconnects. In process 307, a CMP process is carried out to remove conductive humps formed in the WAT process. In process 309, an overlying metallization layer is formed including conductive interconnects and the above processes repeated as indicated by directional arrow 311.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a multi-level semiconductor device comprising the steps of:
    forming a first metallization layer;
    performing a wafer acceptance testing (WAT) process to coincidentally form protruding metal on said first metallization layer extending above said metallization layer surface; and,
    performing chemical mechanical polishing (CMP) on the first metallization layer to remove said protruding metal.

2. The method of claim 1, further comprising the step of performing a thermal treatment prior to the step of performing a wafer acceptance testing (WAT) process.

3. The method of claim 2, wherein the thermal treatment comprises an ambient gas selected from the group consisting of hydrogen-containing gas and inert gas.

4. The method of claim 1, further comprising the step of performing a plasma treatment prior to the step of performing a wafer acceptance testing (WAT) process.

5. The method of claim 4, wherein the plasma treatment comprises a source gas selected from the group consisting of hydrogen-containing gas and inert gas.

6. The method of claim 1, wherein the step of forming a first metallization layer comprises forming first conductive interconnects in a dielectric layer with a dielectric constant less than 3.9.

7. The method of claim 6, wherein the dielectric layer is selected from the group consisting of carbon doped silicon oxide, organo-silicate glass (OSG), fluorinated silicate glass (FSG), and porous dielectrics.

8. The method of claim 6, wherein the first conductive interconnects comprise a metal selected from the group consisting of copper, aluminum, and alloys thereof.

9. The method of claim 1, wherein the WAT process comprises contacting the first metallization layer to apply a voltage.

10. The method of claim 1, wherein the CMP process is carried out to remove conductive humps formed in the WAT process.

11. A method for forming a multi-level semiconductor device comprising the steps of:
    providing a dielectric layer with a dielectric constant less than 3.9;
    forming an opening in the dielectric layer;
    filling the opening with a conductor to form a damascene;
    probing the conductor according to a wafer acceptance testing (WAT) test to coincidentally form protruding conductor portions extending above a damascene surface; and,
    performing a chemical mechanical polishing (CMP) process on the conductor to remove said protruding conductor portions.

12. The method of claim 11, further comprising the step of performing a thermal treatment prior to the step of probing the conductor.

13. The method of claim 12, wherein the thermal treatment comprises an ambient gas selected from the group consisting of hydrogen-containing gas and inert gas.

14. The method of claim 11, further comprising the step of performing a plasma treatment prior to the step of probing the conductor.

15. The method of claim 14, wherein the plasma treatment comprises a source gas selected from the group consisting of hydrogen-containing gas and inert gas.

16. The method of claim 11, wherein the dielectric is selected from the group consisting of carbon doped silicon oxide, organo-silicate glass (OSG), fluorinated silicate glass (FSG), and porous dielectrics.

17. The method of claim 11, wherein the conductor is selected from the group consisting of copper, aluminum, and alloys thereof.

18. The method of claim 11, wherein the step of probing comprises contacting the conductor to apply a voltage.

19. A method for forming a multi-level semiconductor device comprising the steps of:
    providing a metal filled damascene;
    performing a treatment of said metal filled damascene selected from the group consisting of a plasma treatment and a thermal treatment;
    probing the treated metal filled damascene according to a wafer acceptance testing (WAT) test to coincidentally form protruding metal portions comprising said metal filled damascene extending above a metal filled damascene surface; and,
    performing a chemical mechanical polishing (CMP) process on the metal filled damascene to remove said protruding metal portions.

20. The method of claim 19, wherein said treatment step comprises a treatment gas selected from the group consisting of hydrogen-containing gas and inert gas.

* * * * *